United States Patent

Mashino et al.

[15] 3,648,354

[45] Mar. 14, 1972

[54] TAILLESS BONDER FOR FILAMENTARY WIRE LEADS

[72] Inventors: Condon F. Mashino, Lafayette; Carlton D. Barker, Tipton, both of Ind.

[73] Assignee: General Motors Corporation, Detroit, Mich.

[22] Filed: Nov. 17, 1969

[21] Appl. No.: 877,061

[52] U.S. Cl. ..............................29/470.1, 29/471.1, 29/626, 228/3, 228/4, 228/5

[51] Int. Cl. ..............................B23k 21/00

[58] Field of Search ..............................228/3, 4, 5, 3.5; 29/626, 471.1, 29/470.1

[56] References Cited

UNITED STATES PATENTS

| | | | |
|---|---|---|---|
| 3,128,648 | 4/1964 | Clagett | 228/4 |
| 3,510,045 | 5/1970 | Petros et al. | 228/4 X |
| 3,244,344 | 4/1966 | Folk | 228/13 |
| 3,313,464 | 4/1967 | Avedissian | 228/4 X |
| 3,216,640 | 11/1965 | Szasz | 228/3 |

*Primary Examiner*—John F. Campbell
*Assistant Examiner*—R. J. Craig
*Attorney*—William S. Pettigrew and Robert J. Wallace

[57] ABSTRACT

A bonding apparatus and method is disclosed for bonding an interconnecting filamentary wire between two contact pads of a semiconductor device without any significant tail. One form of the apparatus includes an upstanding bonding wedge having a flat side surface, a bonding surface, and a shoulder intersecting the flat side surface forming a wire shearing edge adjacent but not coplanar with the bonding surface. The outlet end of a wire guide tube is moved past the shearing edge and along the flatted surface to sever the wire adjacent the bond.

6 Claims, 9 Drawing Figures

INVENTORS
Condon F. Mashino, &
Carlton D. Barker
BY R. J. Wallace
ATTORNEY

TAILLESS BONDER FOR FILAMENTARY WIRE LEADS

This invention relates to bonding filamentary conductive wires, and more particularly to forming wire interconnections between two spaced apart regions of a semiconductor device such as a discrete transistor, a hybrid thick film circuit, a monolithic circuit or the like.

In the manufacture of a mesa-type monolithic semiconductor device, for example, filamentary conductor wires are required to interconnect spaced apart regions thereon. Typically, these interconnecting conductor wires are fed from a reel of wire and bonded to evaporated metal contacts which separately engage the respective regions. In doing so, one end of the filamentary conductor is pressed on one contact and bonded to the pad by ultrasonic vibration, thermocompression, cold welding or the like. The filamentary conductor is then led to a second contact, and similarly bonded thereto. In commercial production, particularly in high volume commercial production, it is generally more practical that the wire being bonded be part of a reel and led therefrom rather than be a pre-cut length. Accordingly, the wire must be separated or severed from a reel after the second bond.

By way of illustration, a major surface dimension of a monolithic chip can be about 75×75 mils or less. A contact thereon can have dimensions of about 10×10 mils or less. Moreover, there can be numerous contacts on a major surface of a monolithic chip spaced from each other by less than 5 mils. Accordingly, when bonding between two such contacts substantially tailless-type bonds are generally preferred. Elsewise, the relative free-floating or dangling tail could short circuit between two contacts.

One type of prior art tailless producing bonding apparatus is described in United States Ser. No. 831,511, filed on June 9, 1969 in the name of Keisling and assigned to the assignee of the present invention. In this latter bonding technique, a portion of the tip on the bonding tool is tapered such that it severs the filamentary conductor from the reel right on the contact pad in the second bonding step. The geometry of this type of bonding tool is closely related to the diameter of the wire being bonded. Accordingly, in this type of tool a separate tool is required for each diameter of wire to be bonded, if the wire diameters are significantly different. Moreover, because of the close tolerances involved in the geometric relationship of the bonding tip dimensions to the filamentary wire being bonded, bonding tip wear can unduly shorten tool life.

In another type of prior art tailless producing bonding apparatus, the unbonded or reel wire is weakened or thinned immediately adjacent the bond. The unbonded or reel wire can then be separated from the bond by rapidly vibrating or by pulling the unbonded or reel wire adjacent the bonded portion. This technique of wire breaking can deleteriously affect the bond, as the severing or breaking force can be transmitted to the bond.

Accordingly, it is an object of this invention to provide improved apparatus for bonding filamentary conductors between two or more regions of a semiconductor device.

It is another object of this invention to provide improved apparatus for producing substantially tailless type bonds when bonding filamentary conductor wires between two or more regions of a semiconductor device.

It is a further object of this invention to provide an improved method for producing substantially tailless type bonds when bonding filamentary like wires between two or more regions of a semiconductor device.

Other objects, features and advantages of this invention will become apparent from the following description of the preferred examples and from the drawings in which.

Figure 1:
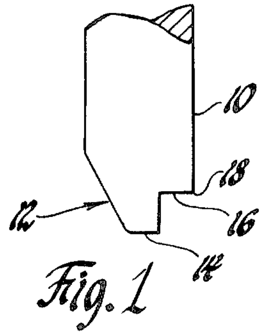
FIG. 1 is a partial elevational view of a bonding wedge made in accordance with this invention.
Figure 2:
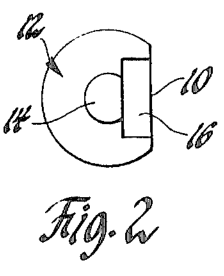
FIG. 2 is an end view of a bonding wedge made in accordance with this invention.

Turning now to the figures, FIGS. 1 and 2 show an upstanding elongated tungsten carbide bonding wedge having a longitudinal flat surface 10. The wedge has a generally semicircular cross section. Only the bonding tip 12 of the wedge is shown. The other end of the bonding wedge is conventionally shaped and is adaptable to be fitted into any of the usual ultrasonic or thermocompression bonding apparatus, not shown. Bonding tip 12 includes a generally rectangular working end surface 14 and a generally rectangular shoulder 16. The working or bonding surface 14 can be planar or grooved to receive the bonding wire, as one desires. Shoulder 16 intersects flat surface 10 to form a generally right angle shearing edge 18. Edge 18 is longitudinally spaced from surface 14 about 3 mils. Bonding surface 14 and shoulder 16 are generally parallel to each other and perpendicular to flat surface 10. Surface 14, which has dimensions of about 10×3 mils, is substantially planar. However, it curves upwardly toward shoulder 16 to prevent damaging the filamentary conductor wires to be bonded as will later become evident. Shoulder 16 also has dimensions of about 10×3 mils.

Turning now primarily to FIGS. 3–9, they show a series of steps illustrating a bonding sequence now to be described. A plurality of semiconductor chips 20 each having a pair of spaced apart upstanding ductile contact pads, labeled 22 and 23, are supported on a suitable fixture or bonding table 24. Contact pads 22 and 23, which are evaporated aluminum contacts, each engage electrically isolated components or regions integrally formed on semiconductor chip 20.

A wire guide tube 26 has a generally vertical leading face 27, adjacent the wedge, a trailing face 28 and a longitudinal bore 29 slidably receiving an aluminum filamentary wire having a diameter of about 5 mils. A wire feed clamp 32 is positioned circumjacent the filamentary conductor wire between a reel or wire source 33 and trailing face 28. Energizing means 34 laterally moves the wedge, tube 26 and wire clamp 32 with respect to the semiconductor chip as a unit or individually, as is required in the particular step of the application involved. It also vertically moves them as a unit. Energizing means 35 opens and closes clamp 32 on the filamentary wire.

Figure 9:
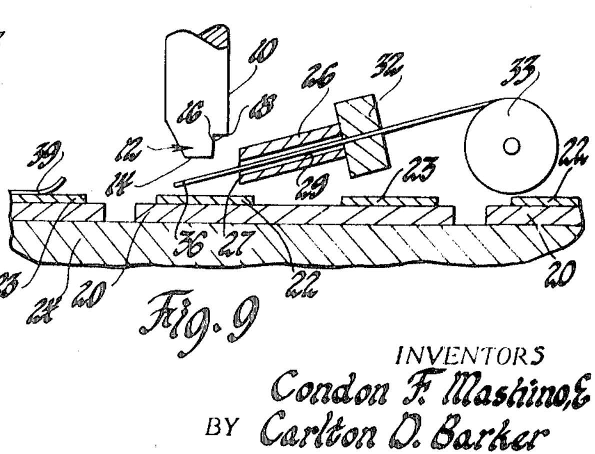

Referring now primarily to FIG. 9, it shows a free end 36 of the filamentary wire protruding from leading face 27 or the wire outlet face, of the guide tube above contact pad 22 and below the working surface 14 of the bonding wedge. Leading face 27 is separated from flatted surface 10 about 4 mils and is generally parallel thereto. Clamp 32 is in abutment with trailing face 28, and is also in engagement with the wire. Reel 33 provides the source wire to the assembly.

Figure 3:
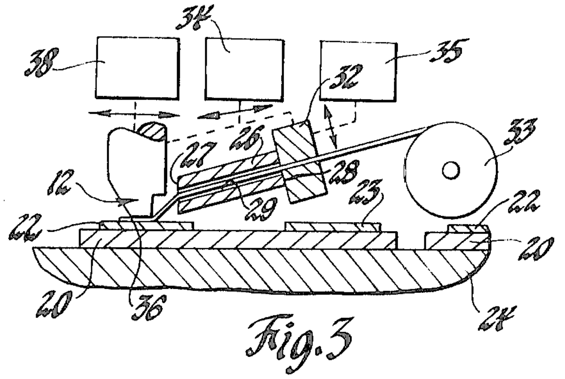
FIGS. 3–9 are views illustrating a bonding method according to the invention.
Figure 4:
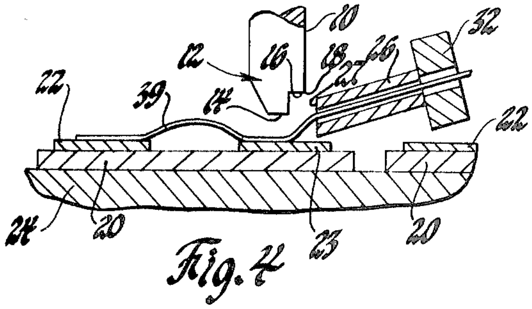
Figure 5:
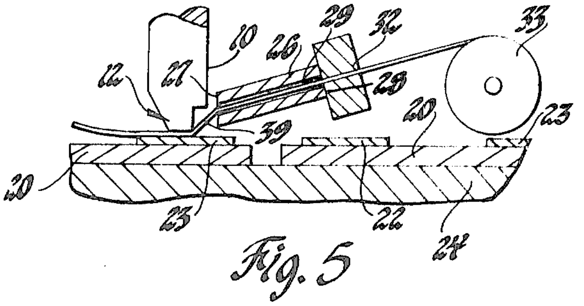
Figure 6:
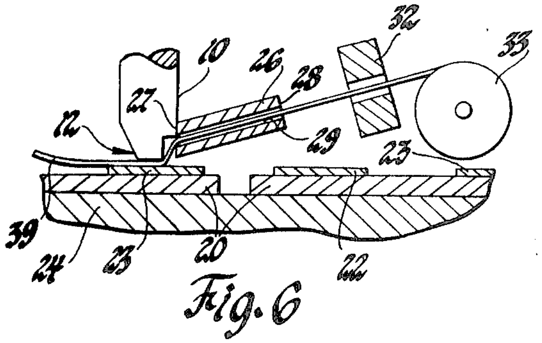

In order to bond free end 36 of the wire, bonding tip 12 moves downwardly forcing surface 14 into pressing engagement with free end 36 on contact pad 22 as is shown in FIG. 3. The bonding energy can be by any conventional means, not shown, such as ultrasonic, thermocompression, cold welding or the like. For ultrasonic bonding, bonding means 38 is provided for rapidly vibrating bonding tip 12 generally parallel to the plane of the contact to make the ultrasonic type bonds. After free end 36 is bonded to contact 22, bonding tip 12 moves upwardly about 20 mils. Clamp 32 then releases from the wire forming an opening generally coaxial with bore 29. Bonding tip 12, tube 26 and clamp 32 then move as a unit relative to table 24 until bonding surface 14 generally overlies contact pad 23, as is shown in FIG. 4. In doing so, a sufficient amount of the conductor is allowed to freely pass through tube 26 and clamp 32 to form a loop 39 of the wire leading to the second contact pad 23. The unbonded end of loop 39 is, thusly, positioned intermediate surface 14 and the second contact pad 23. The bonding wedge is then moved downwardly until bonding surface 14 is brought into pressing engagement with the unbonded end of loop 39 on contact pad 23, where it is ultrasonically bonded into place as shown in FIG. 5. During this latter step, the wire guide tube 26 and the clamp 32 move with the tip except for the last movement in which the tip contacts the wire.

Figure 7:
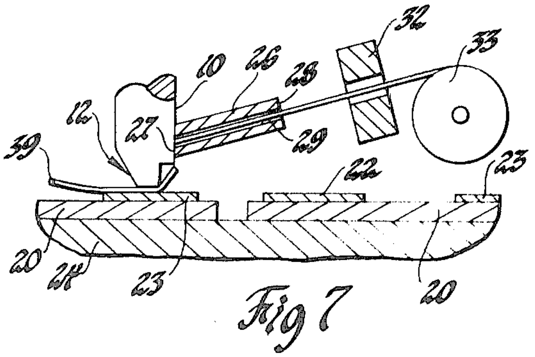

After the wire bond is made on contact pad 23, wire feed tube 26 moves axially along the filamentary wire until leading face 27 abuts flatted surface 10. Feed clamp 32 moves along the wire in an opposite direction toward the reel, a short distance. Wire guide tube 26 and wire feed clamp 32 then move upwardly as a unit while the bonding surface 14 of the bonding tip remains in pressing engagement with the second bond on contact pad 23. During this upward motion which is about 10 mils for 5-mil diameter wire, shearing edge 18 and leading face 27 cooperate in scissorlike fashion to sever the filamentary wire at shearing edge 18 as is shown in FIG. 7. This produces a substantially tailless-type bond on contact pad 23 without a detrimental tail. The tail on contact pad 23 has a length equal to the approximate distance between shearing edge 18 and bonding surface 14, or about 3 mils.

Figure 8:
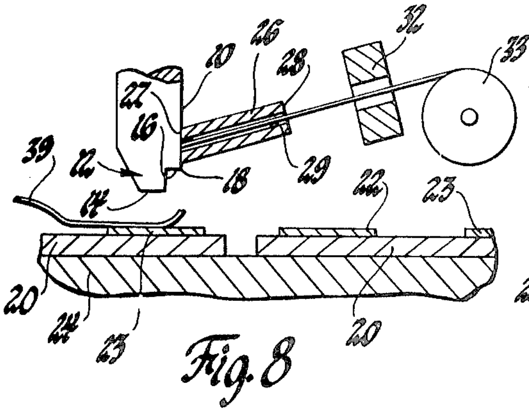

The bonding surface, tube 28 and clamp 32 then move as a unit upwardly about 20 mils above the tail attached to the second bond, as is shown in FIG. 8, and are subsequently repositioned over another semiconductor chip to make the next wire interconnection. Tube 26 and clamp 32 then move as a unit downwardly and also away from flatted surface 10 such that bore 29 of tube 26 is beneath bonding surface 14 and about 4 mils from surface 10. Clamp 32 is then closed to engage the filamentary wire. Clamp 32 is then moved coaxially along the wire toward tube 26 until it abuts trailing face 28 over guide tube 26, shuttling the wire through the guide tube. A free end of the filamentary wire is thus again positioned underneath bonding surface 14, and the sequence as described in the foregoing may be repeated.

It should be noted that although the bonding tip of the herein described preferred embodiment was made of tungsten carbide, other materials having the requisite hardness may also be used. Furthermore, it should be noted that although the shoulder of the bonding tip as herein described is spaced from the bonding surface about 3 mils, this distance should be less than the distance between any two adjacent contact pads or any contact pad and an adjacent conductor on the semiconductor device. However, where a particular contact spacing permits, this distance should increase generally proportional to the wire size to avoid abrupt turns in the larger wire size.

It should also be noted that although the bonding sequence of the nature here described specifies particular movement distance, the invention is not to be so limited. These dimensions are, of course, related to the size of the wire used, the configurations of the contacts on a semiconductor chip and the like.

It should be further noted that although the herein described bonding method recites a particular sequence of steps, deviations can be made therefrom within the inventive concept herein described. For example, the clamp as herein described may be moved along the wire toward the wire source prior to the first wire bond or in any one of the subsequent steps. However, the herein described sequence is preferred.

It should still be further noted that although the wedge, the wire guide tube and the clamp was herein described as moving as a unit relative to the bonding table, the table can easily be adapted to move relative to the wedge, tube and clamp. Moreover, it should also be pointed out that the wire guide tube need only move vertically relative to the flatted surface of the wedge.

We claim:

1. In a pressure bonding apparatus for bonding interconnecting filamentary conductor wires on semiconductor devices, the improvement which comprises an upstanding bonding wedge, a bonding tip on said wedge having a bonding surface, a shoulder on said wedge adjacent said tip, a flat side surface on said wedge longitudinally extending from said shoulder, said shoulder intersecting said side surface of said wedge to form a shearing edge thereon closely adjacent said bonding surface, wire feed means for feeding a free end of a filamentary conductor wire from a wire source past said shoulder to a position under said bonding surface, wire guide means intermediate said wire feed means and said bonding tip for receiving the wire from said wire feed means, means for moving said wedge, guide means and feed means as a unit to bond the filamentary wire to a bonding pad, and means for moving said guide means and said feed means relative to said side surface of said wedge to shear said filamentary wire on said wedge shoulder to produce a substantially tailless-type bond.

2. The apparatus as recited in claim 1 wherein the distance between the shearing edge and the bonding surface of said tip is less than the distance from a contact pad to any adjacent conductor on the semiconductor device.

3. The apparatus as recited in claim 2 wherein the bonding surface and the shoulder are generally parallel to each other and generally perpendicular to the longitudinal side surface on the wedge.

4. In a pressure bonding apparatus for bonding interconnecting filamentary wires on a semiconductor device having at least two spaced apart contacts, the improvement which comprises an upstanding bonding wedge including a bonding tip having a bonding surface, a shoulder, and a generally flat longitudinally extending side surface, said bonding surface and said shoulder being generally parallel to each other and perpendicular to said side surface, said shoulder intersecting said side surface forming a shearing edge thereon spaced from said bonding surface less than the distance between a contact pad and any adjacent conductor, wire shuttle means for feeding a filamentary conductor wire having a free end to be bonded from a wire source past said shoulder to a position under the bonding surface, wire guide means intermediate said wire shuttle means and said bonding tip for receiving the wire from said wire shuttle means including a tube having a leading face, means for engaging said shuttle means to move the wire through said tube, means for moving said wedge, said tube and said shuttle means as a unit to bond the filamentary wire to a contact pad, and means for moving said tube and said shuttle means relative to said side surface of said wedge while said leading face is abutted thereto to shear said filamentary wire on said shoulder to produce a substantially tailless-type bond.

5. A method of pressure bonding interconnecting filamentary conductor wires on semiconductor devices without producing a detrimental tail which comprises feeding a filamentary wire through a wire guide tube to form a free end over a first ductile contact pad, positioning over said wire a pressure bonding wedge having a bonding surface, an adjacent shoulder, and a flat side surface extending from said shoulder, pressing the bonding surface of said wedge against said wire to bond the free end to said first ductile pad, moving said bonding wedge relative to said first contact pad to a position overlying a second ductile contact pad while concurrently allowing the wire to pass freely under said bonding surface from an adjacent wire guide tube, pressing the extended wire portion underlying the bonding surface against said second pad to bond the wire thereto, moving said tube relative to said wedge side surface to sever said wire on said shoulder to produce a substantially tailless-type bond.

6. A method of pressure bonding interconnecting filamentary conductor wires on a semiconductor device without producing any significant tail which comprises feeding a filamentary conductor from a reel through a wire guide tube having a leading and a trailing face to form a free end over a first ductile metal contact pad by engaging the wire with a wire clamp and moving the clamp into engagement with said trailing face of said tube, positioning over said wire a pressure bonding wedge having a bonding surface, an adjacent shoulder and a flat side surface extending from said shoulder, pressing the bonding surface of said wedge against said wire while engaging the wire with said clamp to bond the free end to said first ductile pad, moving said wedge relative to said first contact pad to a position overlying a second ductile contact pad while concurrently allowing the wire to pass freely under said shoulder through said wire guide tube and said wire clamp, pressing the bonding surface of said wedge against the underlying wire on said second pad while engaging the wire with said clamp making a wire bond thereto, abutting said leading face of said tube against said side surface, moving said clamp along said wire away from said trailing face of said tube a short distance and moving said tube relative to said side surface to sever said wire on said shoulder producing a substantially tailless-type bond.

* * * * *